United States Patent
Wu et al.

(10) Patent No.: US 7,138,338 B2
(45) Date of Patent: Nov. 21, 2006

(54) METHOD AND COMPOSITE HARD MASK FOR FORMING DEEP TRENCHES IN A SEMICONDUCTOR SUBSTRATE

(75) Inventors: Chang-Rong Wu, Taipei County (TW); Yinan Chen, Taipei (TW); Tuz-Ching Tsai, Taoyuan County (TW)

(73) Assignee: NANYA Technology Corporation, Taoyuan (TW)

( * ) Notice: Subject to any disclaimer, the term of this patent is extended or adjusted under 35 U.S.C. 154(b) by 107 days.

(21) Appl. No.: 10/810,804

(22) Filed: Mar. 29, 2004

(65) Prior Publication Data

US 2005/0215061 A1 Sep. 29, 2005

(51) Int. Cl.
*H01L 21/311* (2006.01)
(52) U.S. Cl. ............ 438/702; 438/763; 438/786; 257/301; 257/E21.035
(58) Field of Classification Search .......... 438/702, 438/763, 786; 257/301, E21.035
See application file for complete search history.

(56) References Cited

U.S. PATENT DOCUMENTS 6,303,466 B1 * 10/2001 Shimonishi et al. ........ 438/424
6,933,206 B1 * 8/2005 Beintner et al. ............ 438/435

* cited by examiner

*Primary Examiner*—Fernando L. Toledo
(74) *Attorney, Agent, or Firm*—Bacon & Thomas, PLLC

(57) ABSTRACT

A method and structure for forming deep trenches in a semiconductor substrate is provided. The method comprises: providing a semiconductor substrate; forming a pad oxide layer on the semiconductor substrate; forming a pad nitride layer on the pad oxide layer; forming a borophosphosilicate glass layer on the pad nitride layer; forming a borosilicate glass layer on the borophosphosilicate glass layer; and forming deep trenches through the borosilicate glass layer, through the borophosphosilicate glass layer, through the pad nitride, through the pad oxide, and into the semiconductor substrate. The borosilicate glass layer and the borophosphosilicate glass layer function as a composite hard mask in forming the deep trenches. With the borophosphosilicate glass layer, the composite hard mask can be easily removed by dry etch process using hydrogen fluoride vapor after the deep trenches have been formed.

6 Claims, 5 Drawing Sheets

METHOD AND COMPOSITE HARD MASK FOR FORMING DEEP TRENCHES IN A SEMICONDUCTOR SUBSTRATE

FIELD OF THE INVENTION

The present invention relates to a method and composite hard mask for forming deep trenches in a semiconductor substrate, particularly to the utilization of a novel composite hard mask in deep trench etching process.

BACKGROUND OF THE INVENTION

In fabricating semiconductor devices, trenches are formed in a semiconductor substrate to isolate active devices therein, or serve in part as a structure for fabricating dynamic random access memory (DRAM). The process for fabricating the trench typically includes defining an opening of the trench through a photolithography process and performing an anisotropic etching. Subsequent processes may be carried out according to the material characteristics of the semiconductor device.

FIGS. 1 to 4 are cross-sectional views of a conventional semiconductor structure 10 illustrating deep trenches formed in a semiconductor substrate 12 by a known method. As shown in FIG. 1, a conventional method of forming the deep trenches in the semiconductor substrate includes forming a pad oxide layer 14 on the semiconductor substrate 12 of the semiconductor structure 10, depositing a pad nitride layer 16 on the pad oxide layer 14 and depositing a borosilicate glass (BSG) layer 18 on the pad nitride layer 16. The borosilicate glass layer 18 will serve as a hard mask in subsequent deep trench silicon etching process. An un-doped silicate glass layer 20 is deposited on the borosilicate glass layer 18 for the purpose of anti-humidity and protection. The structure 10 is then subject to an annealing process. Subsequently, a photolithography process is imposed on the structure 10, which includes coating a photoresist layer 22 on the un-doped silicate glass layer 20, patterning and exposing the photoresist layer 22, and removing a portion of the photoresist layer 22 to form openings 24, so as to facilitate the formation of desired deep trenches 28 residing at the position shown by the dashed lines 26 under the openings 24.

As shown in FIG. 2, after etching process, the un-doped silicate glass layer 20 beneath the openings 24, the borosilicate glass layer 18, the pad nitride layer 16, the pad oxide layer 14 and semiconductor substrate 12 are etched away, and then deep trenches 28 are formed at the position shown by dashed lines 26 of FIG. 1. In addition, the photoresist layer 22 and the un-doped silicate glass 20 have been removed as well. The etching process includes removing the un-doped silicate glass layer 20 beneath the opening 24, the borosilicate glass layer 18, the pad nitride layer 16 and the pad oxide layer 14 by known anisotropic etching process. The silicon substrate 12 no longer covered by the hard mask may be etched by dry etching process known in the art.

After the deep trenches have been formed, the borosilicate glass layer 18 in FIG. 2 is removed. As shown in FIG. 3A, when using the vapor of hydrogen fluoride (VHF) to remove the borosilicate glass layer 18, it is difficult to completely remove the borosilicate glass layer 18 away, such that a portion of the borosilicate glass layer 18 still remains thereon. This is because when performing the aforementioned annealing process, due to elevated temperature, the boron in the borosilicate glass layer 18 would tend to diffuse upward from the junction of the borosilicate glass layer 18 and pad nitride layer 16 (i.e., toward the direction of the un-doped silicate glass layer 20 of FIG. 1), such that the region in the borosilicate glass layer 18 adjacent to the junction forms an un-doped silicate glass layer. In comparison with a doped silicate glass layer, the un-doped silicate glass layer is more difficult to be removed by using the vapor of hydrogen fluoride.

On the other hand, when utilizing liquid hydrogen fluoride (HF) to etch the borosilicate glass layer 18, undercut 17 would form in the pad oxide layer 14, as shown in FIG. 3B. The results shown in both FIGS. 3A and 3B adversely influence the subsequent processes, increase the fabrication costs and may degrade the fabrication yields. Therefore, we do not desire these to occur.

Attempt has been made to avoid the conditions shown in FIGS. 3A and 3B by omitting the annealing process in the aforementioned trench forming process, however, this would result in defective profiles of the deep trenches. It is believed that the annealing process is carried out to facilitate obtaining better profile of deep trenches after performing the deep trench etching steps. However, the approach of omitting the annealing process to prevent the boron in the borosilicate glass layer 18 from diffusing upward, in order to obtain better hard mask removal, would result in abnormal critical dimensions of the deep trenches for the 0.11-micron technology generation, for example, inconsistent width of deep trenches 28' and 28" as depicted in FIG. 4.

It is desirable to provide a method and structure for forming deep trenches in a semiconductor substrate which ensure good profile of the deep trenches and easy removal of the hard mask.

SUMMARY OF THE INVENTION

The present invention provides a method for forming deep trenches in a semiconductor substrate. The method and structure utilize a borosilicate glass layer and a borophosphosilicate glass layer to form a composite hard mask. With the borophosphosilicate glass layer serving as a strip layer, the composite hard mask can be easily removed by dry etching using hydrogen fluoride vapor after the deep trenches have been formed. More specifically, the method comprises providing a semiconductor substrate; forming a pad oxide layer on the semiconductor substrate; forming a pad nitride layer on the pad oxide layer; forming a borophosphosilicate glass layer on the pad nitride layer; forming a borosilicate glass layer on the borophosphosilicate glass layer; and forming deep trenches through the borosilicate glass layer, the borophosphosilicate glass layer, the pad nitride layer, the pad oxide layer and into the semiconductor substrate.

The present invention also provides a structure for forming deep trenches in a semiconductor substrate. The structure comprises a semiconductor substrate; a pad oxide layer on the semiconductor substrate; a pad nitride layer on the pad oxide layer; a borophosphosilicate glass layer on the pad nitride layer; and a borosilicate glass layer on the borophosphosilicate glass layer.

According to the present invention, the borophosphosilicate glass layer and the borosilicate glass layer formed on the borophosphosilicate glass layer serve as a hard mask for forming deep trenches in the semiconductor substrate. While most boron in the borophosphosilicate glass layer will diffuse upward in a direction toward the borosilicate glass layer after the semiconductor structure being subject to an annealing process, little phosphorus diffuse upward. Abundant phosphorus doped in the borophosphosilicate glass layer enables the borophosphosilicate glass layer to be easily and completely removed away from the semiconductor substrate by using the vapor of hydrogen fluoride.

BRIEF DESCRIPTION OF THE DRAWINGS

Following figures only depict the correlations between elements, not conforming to the proportion of real dimension. In addition, like numerals in the drawings present like elements or features.

DETAILED DESCRIPTION OF THE PREFERRED EMBODIMENTS

Figure 5:
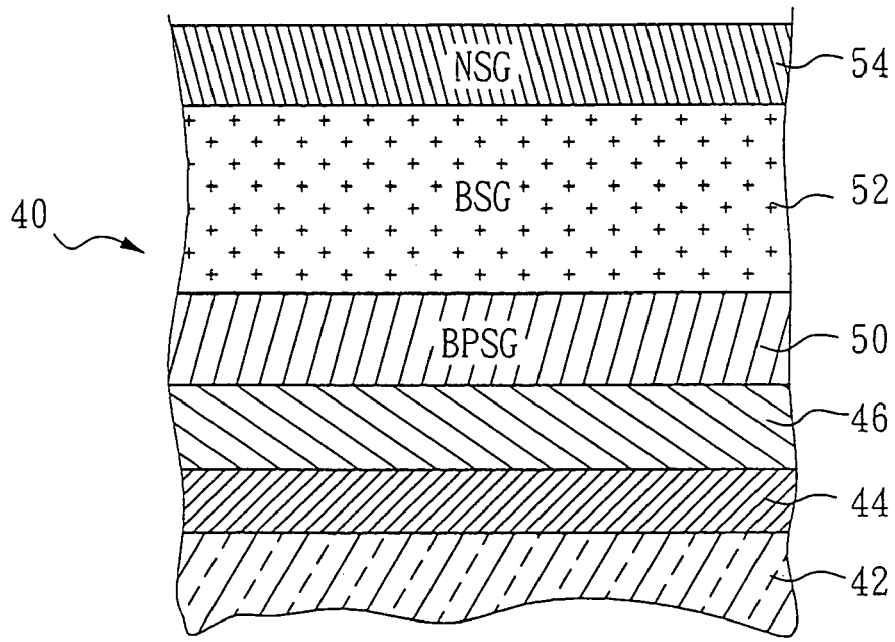
FIG. 5 depicts a cross-sectional view of a semiconductor electronic structure for forming deep trenches in a semiconductor substrate in accordance with the present invention, illustrating a hard mask composed of a borosilicate glass layer and a borophosphosilicate glass layer formed on the semiconductor substrate.

FIG. 5 shows a cross-sectional view of an electronic structure 40 having deep trenches made by a method according to the present invention. The electronic structure 40 comprises: a pad oxide layer 44 on a semiconductor substrate 42; a pad nitride layer 46 on the pad oxide 44; a borophosphosilicate glass layer 50 on the pad nitride layer 46; and a borosilicate glass layer 52 on the borophosphosilicate glass layer 50.

The semiconductor substrate 42 includes semiconductor material, such as silicon. The pad oxide layer 14 and pad nitride layer 16 both can be formed by any conventional means. The borophosphosilicate glass layer 50 and borosilicate glass layer 52, both of which function as a composite hard mask can be formed by any conventional means, such as thin film deposition technology. An un-doped silicate layer 54 may also be deposited on the borosilicate glass layer 52 to serve as a protection layer. Followed the formation of hard mask, the electronic structure 40 is typically subject to annealing process to facilitate the subsequent processes.

Figure 6:
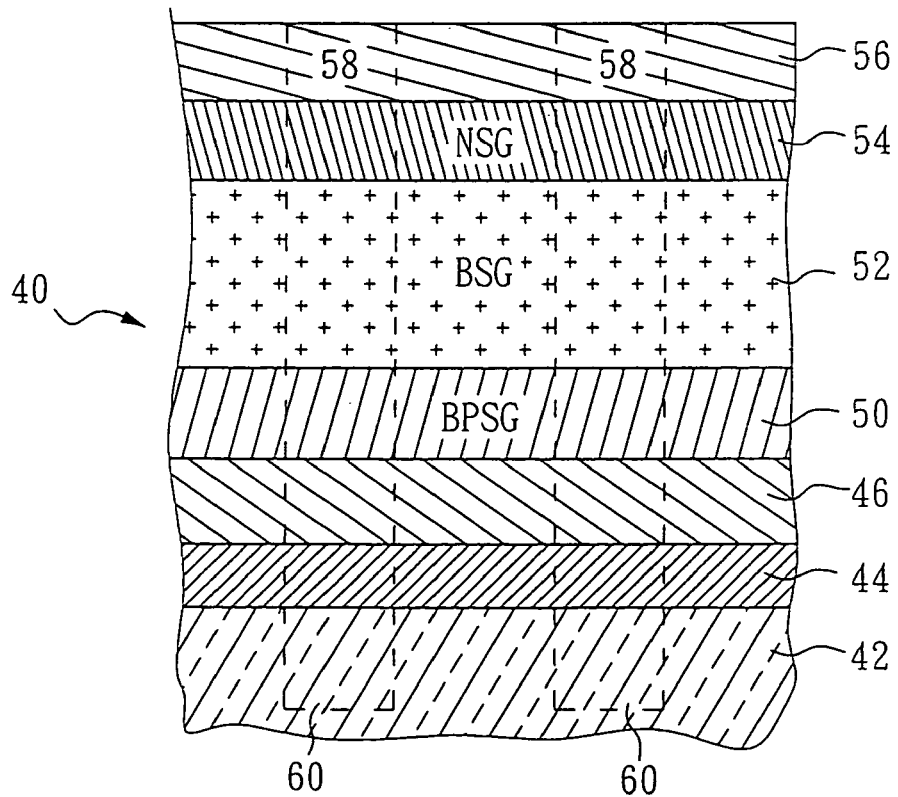
FIG. 6 depicts a photoresist layer on the hard mask of FIG. 5.

FIG. 6 shows a photoresist layer 56 deposited on the un-doped silicate layer 54 of the annealed electronic structure 40 and then patterned and exposed by radiation such as ultra-violet light. Subsequently, a portion of the photoresist layer 56 is removed to form openings 58 beneath which deep trenches are to be formed in portions depicted by dashed lines 60.

Figure 7:
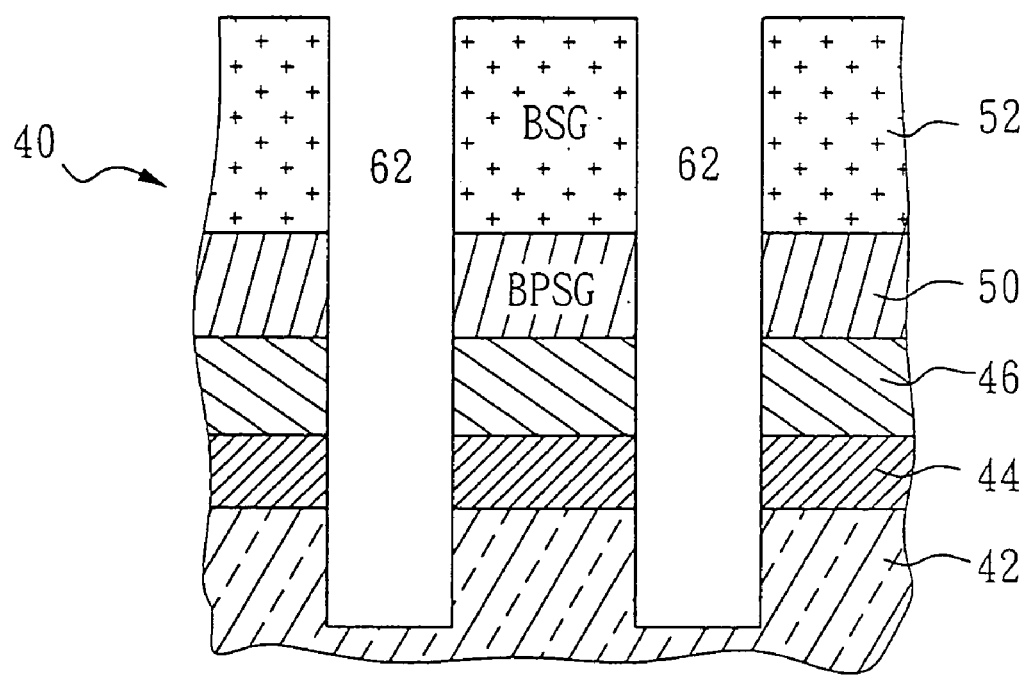
FIG. 7 depicts the semiconductor substrate of FIG. 6 having deep trenches therein.

FIG. 7 shows that the portions within the dashed lines 60 of FIG. 6, the un-doped silicate layer 54, borosilicate glass layer 52, borophosphosilicate glass layer 50, pad nitride layer 46, pad oxide layer 44 and semiconductor substrate 42 have been etched away through a conventional anisotropic dry etching process, Deep trenches 62 thus are formed at the original locations depicted by the dashed lines 60 of FIG. 6, and the dimensions of such deep trenches 62 are substantially identical to each other. In addition, the photoresist layer 56 and un-doped silicate layer 54 in FIG. 6 are removed as well.

Figure 1:
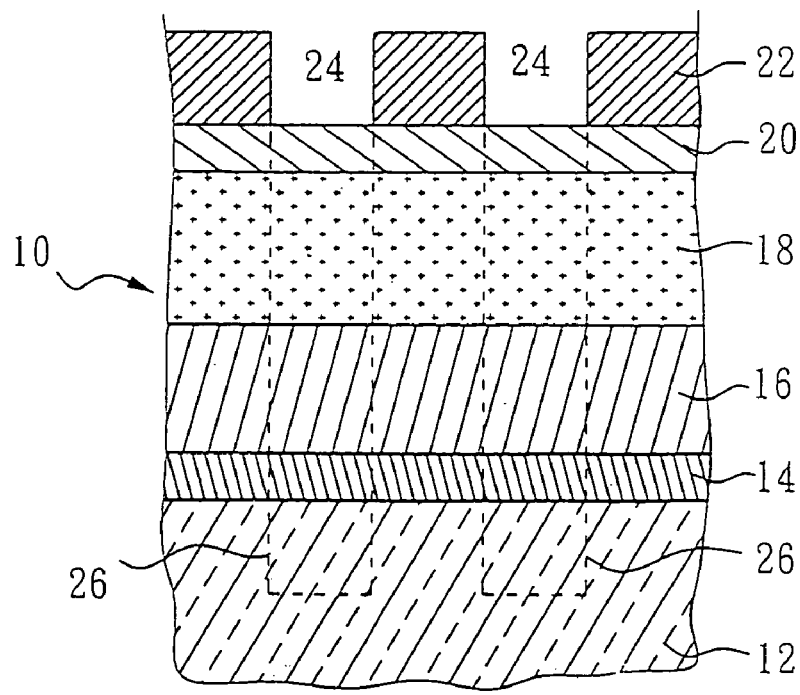
FIG. 1 depicts a cross-sectional view of a conventional semiconductor electronic structure made according to known processes.
Figure 2:
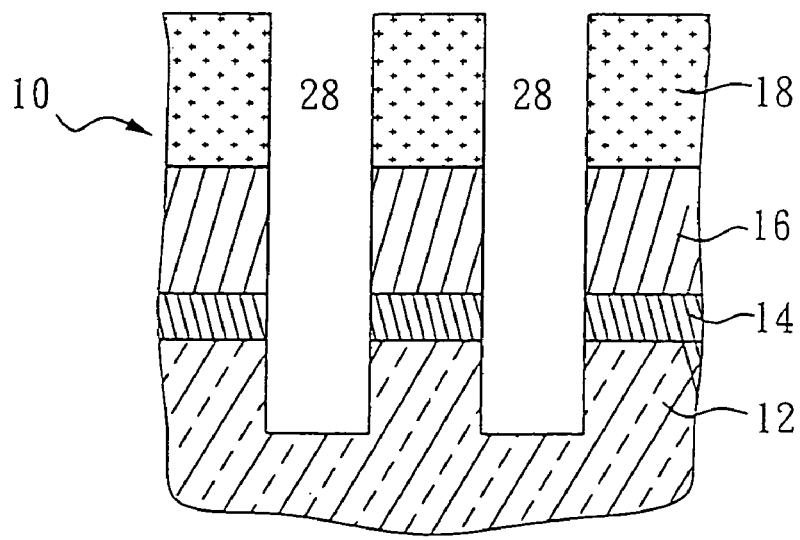
FIG. 2 depicts a cross-sectional view of the semiconductor structure of FIG. 1 with deep trenches formed therein.
Figure 3A:
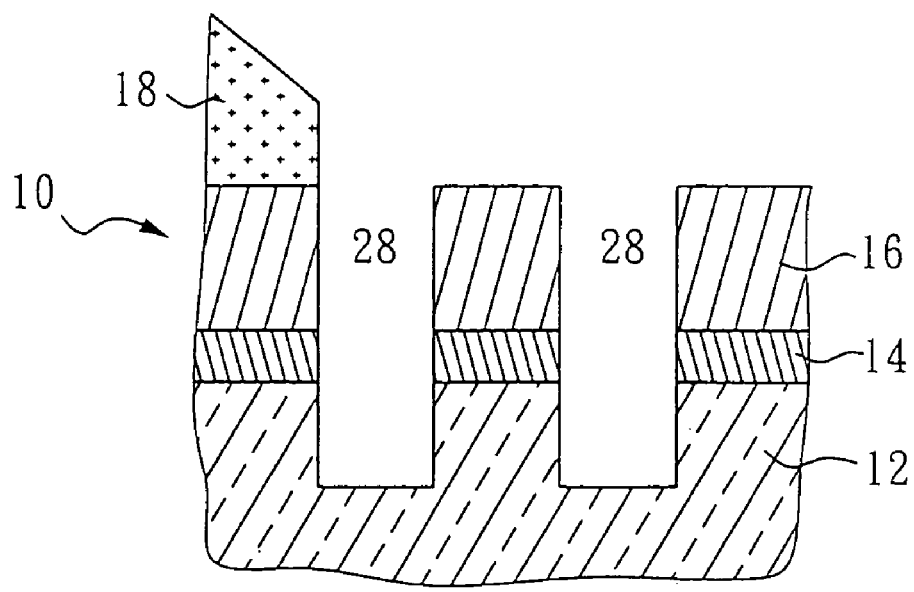
FIG. 3A depicts a residual of borosilicate glass layer on the structure of FIG. 2 after being etched by vapor of hydrogen fluoride.
Figure 3B:
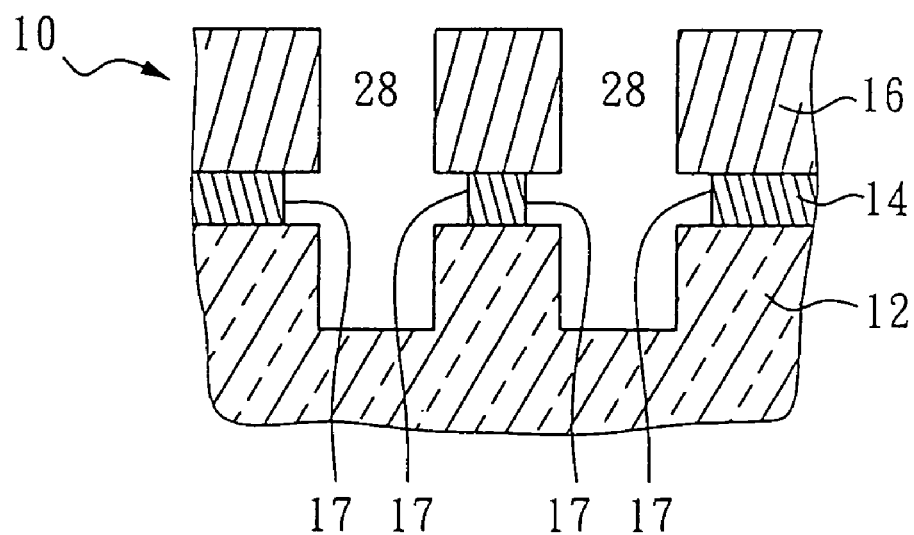
FIG. 3B depicts undercuts in a pad oxide layer on the structure of FIG. 2 after being etched by liquid hydrogen fluoride.
Figure 4:
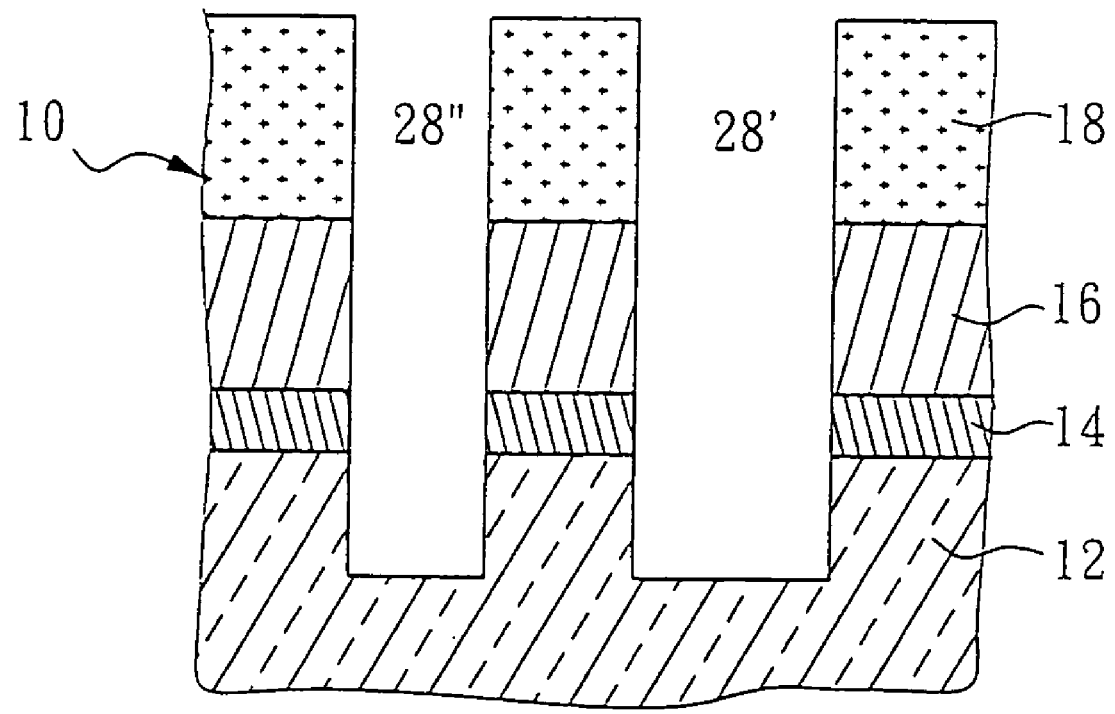
FIG. 4 depicts a cross-sectional view of the structure of FIG. 1 without being treated with annealing process prior to forming deep trenches therein, illustrating defective profile of the formed deep trenches.
Figure 8:
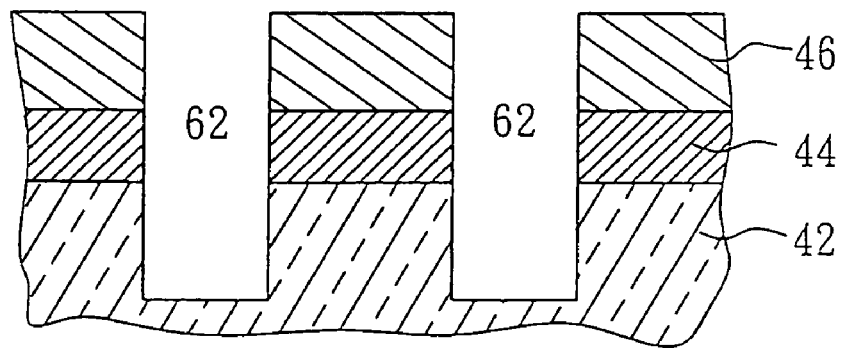
FIG. 8 depicts a cross-sectional view of the structure of FIG. 7, after the hard mask has been removed from the structure by using vapor of hydrogen fluoride.

As shown in FIG. 8, through conventional anisotropic dry etching process such as reactive ion etch using the vapor of hydrogen fluoride, the hard mask composed of the borosilicate glass layer 52 and borophosphosilicate glass layer 50 of FIG. 7 is easily and completely removed away. The reason is after the borophosphosilicate glass layer 50 has been subject to the annealing process, boron in the lay 50 has been reduced due to diffusion effect, while most phosphor remain in the silicate glass of said layer. Therefore, it is easy to remove the borophosphosilicate glass layer 50 utilizing the vapor of hydrogen fluoride, and in turn the borosilicate glass layer 52 on the borophosphosilicate glass layer 50 can be removed as well. That is, the borophosphosilicate glass layer 50 servers as a "strip layer" for the composite hard mask to facilitate its removal without the drawback of prior art as shown in FIG. 3A.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for forming deep trenches in a semiconductor substrate, the method comprising:
    providing a semiconductor substrate;
    forming a pad oxide layer on the semiconductor substrate;
    forming a pad nitride layer on the semiconductor substrate;
    forming a borophosphosilicate glass layer on the pad nitride layer;
    forming a borosilicate glass layer on the borophosphosilicate glass layer, wherein the borophosohosilicate glass layer and the borosilicate glass layer together form a composite hard mask for forming deep trenches, with the borophosphosilicate glass layer serving as a strip layer for the composite hard mask; and
    forming deep trenches through the borosilicate glass layer, the borophosphosilicate glass layer, the pad nitride layer, the pad oxide layer and into the semiconductor substrate.

2. The method according to claim 1, further comprising performing an annealing process between the steps of forming the borosilicate glass layer and the deep trenches.

3. The method according to claim 1, further comprising utilization of vapor of hydrogen fluoride to etch the borosilicate glass layer and the borophosphosilicate glass in an anisotropic manner.

4. A structure for forming deep trenches in a semiconductor substrate, the structure comprising:
    a semiconductor substrate;
    a pad oxide layer on the semiconductor substrate;

a pad nitride layer on the pad oxide layer;

a borophosphosilicate glass layer on the pad nitride layer;

and a borosilicate glass layer on the borophosphosilicate glass layer, wherein the borophosphosilicate glass layer and the borosilicate glass layer together form a composite hard mask for forming deep trenches, with the borophosphosilicate glass layer serving as a strip layer for the composite hard mask.

5. The method according to claim 1, further comprising forming an un-doped silicate layer on the borosilicate layer before forming the deep trenches.

6. The method according to claim 1, further comprising the step of completely removing the borophosphosilicate glass layer and the borosilicate glass layer after the deep trenches are formed.

* * * * *